(12) United States Patent
Satake

(10) Patent No.: US 8,735,275 B2
(45) Date of Patent: May 27, 2014

(54) SEMICONDUCTOR DEVICE AND METHOD OF MANUFACTURING THE SAME

(75) Inventor: Nobuo Satake, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 359 days.

(21) Appl. No.: 12/775,691

(22) Filed: May 7, 2010

(65) Prior Publication Data

US 2010/0279501 A1  Nov. 4, 2010

Related U.S. Application Data

(60) Division of application No. 11/093,040, filed on Mar. 30, 2005, now Pat. No. 7,741,713, which is a continuation of application No. PCT/JP03/04749, filed on Apr. 15, 2003.

(51) Int. Cl.
*H01L 21/44* (2006.01)

(52) U.S. Cl.
USPC .......... 438/612; 438/613; 257/E21.508; 257/E23.02; 257/E23.021

(58) Field of Classification Search
None
See application file for complete search history.

(56) References Cited

U.S. PATENT DOCUMENTS

| | | | |
|---|---|---|---|
| 5,406,122 A * | 4/1995 | Wong et al. | 257/753 |
| 6,008,542 A | 12/1999 | Takamori | |
| 6,069,066 A * | 5/2000 | Huang et al. | 438/612 |
| 6,130,141 A | 10/2000 | Degani et al. | |
| 6,133,582 A | 10/2000 | Osann, Jr. et al. | |
| 6,255,737 B1 | 7/2001 | Hashimoto | |
| 6,261,944 B1 * | 7/2001 | Mehta et al. | 438/624 |
| 6,340,608 B1 * | 1/2002 | Chooi et al. | 438/108 |
| 6,441,467 B2 | 8/2002 | Toyosawa et al. | |
| 6,500,748 B2 * | 12/2002 | Anand | 438/612 |
| 6,617,696 B1 | 9/2003 | Bendal | |
| 6,630,736 B1 | 10/2003 | Ignaut | |

(Continued)

FOREIGN PATENT DOCUMENTS

| | | |
|---|---|---|
| CN | 1210622 A | 3/1999 |
| JP | 4-250618 A | 9/1992 |
| JP | 7-201866 A | 8/1995 |
| JP | 2002-313835 A | 10/2002 |
| JP | 2003-68736 A | 3/2003 |

OTHER PUBLICATIONS

Chinese Office Action dated Oct. 12, 2007, issued in corresponding Chinese Patent Application No. 03824956.1.

(Continued)

*Primary Examiner* — Hoang-Quan Ho
(74) *Attorney, Agent, or Firm* — Westerman, Hattori, Daniels & Adrian, LLP

(57) ABSTRACT

After a plurality of pads (2) are formed on an insulation film (1), a passivation film (3) is formed on the entire surface thereof, and opening parts (3a) which exposes all the pads (2) are formed in the passivation film (3). Next, another passivation film is formed on the entire surface and, for each of the pads (2), an opening part is formed in this passivation film to expose the central portion of the pad (2). According to the above method, the probing test can be performed with the opening parts (3a) formed in the passivation film (3). Performing the probing test in such a state increases the probability that the probe contacts the pad (2) since the entire surface of the pad (2) is exposed, thereby providing the test with a higher accuracy. Thus, the pad can be miniaturized and/or the pitch can be narrowed without requiring a higher accuracy of the probe.

7 Claims, 11 Drawing Sheets

(56) References Cited

U.S. PATENT DOCUMENTS

| | | | |
|---|---|---|---|
| 6,649,533 B1 | 11/2003 | Iacoponi | |
| 6,650,002 B1 | 11/2003 | Toyosawa et al. | |
| 6,717,270 B1 * | 4/2004 | Downey et al. | 257/758 |
| 6,753,609 B2 * | 6/2004 | Chien et al. | 257/761 |
| 6,960,829 B2 * | 11/2005 | Hogerl | 257/737 |
| 2002/0163083 A1 * | 11/2002 | Hatano et al. | 257/762 |
| 2002/0173133 A1 * | 11/2002 | Towle et al. | 438/612 |
| 2002/0197843 A1 * | 12/2002 | Jiang et al. | 438/613 |

OTHER PUBLICATIONS

Chinese Office Action dated Dec. 29, 2006, issued in corresponding Chinese Patent Application No. 03824956.1.
Prior Art List.

* cited by examiner

SEMICONDUCTOR DEVICE AND METHOD OF MANUFACTURING THE SAME This application is a division of U.S. application Ser. No. 11/093,040, filed on Mar. 30, 2005 now U.S. Pat. No. 7,741,713 which is Continuation of International Application No. PCT/JP03/04749, filed on Apr. 15, 2003, the entire contents of which are incorporated herein by reference.

TECHNICAL FIELD

The present invention relates to a semiconductor device and a manufacturing method of the same suitable for miniaturizing pads thereof.

BACKGROUND ART

Conventionally, the size of pads (Al electrodes) provided in a semiconductor device has been reduced, along with their interval (pitch) getting narrower. Typically, a passivation film is formed so as to cover pads in a semiconductor device, with an opening part formed on the passivation film to expose a portion of each of the pads.

However, in a semiconductor device wherein a probing test is performed before a bump is formed on a pad, conditions of the probing test (such as accuracy of the probe) depend on the size of an opening part of the passivation film in which the opening part was formed so that the pad is exposed. For example, if the pitch of the pads is reduced to 30 µm or less, the opening part formed on the passivation film is rendered square-shaped with a side length of about 15 µm. In this case, although it is necessary to keep the tip diameter of the probe for use in the probing test always to 10 µm or less, the cost of such a probe is very expensive and unsuitable for mass production.

In addition, the strength of the probe inevitably decreases in order to provide the probe with high pin-counts of about 100 to 1000 pins while maintaining its high-accuracy positioning. This is because of the submicron accuracy required to maintain its high-accuracy positioning (accuracy in three mutually-perpendicular directions).

In the present circumstances as stated above, miniaturization of the pads may make the proving test difficult or increase the cost of the probing test, particularly with a semiconductor device wherein a plurality of pads are aligned in one direction.

Also, in a semiconductor device wherein the probing test is performed after a bump has been formed on the pad, the pitch is limited to about 30 µm to 40 µm, with the side length of the square-shaped pad being limited to about 20 µm to 30 µm in order to perform the probing test. Additionally, with such a semiconductor device, if a defect is found by the test after a bump has been formed, it is difficult to determine whether the defect had existed before the bump was formed, or the defect arose during the formation of the bump.

[Patent Document 1]
Japanese Patent Application Laid-open No. 2003-068736

SUMMARY OF THE INVENTION

It is therefore an object of the present invention, contrived in view of the above-mentioned problems, to provide a semiconductor device and a method of manufacturing the same, wherein a probing test can be readily performed before bumps are formed, even if pads are miniaturized.

The inventor has devised, as the consequence of a devoted deliberation to solve the above-mentioned problems, the following aspects of the present invention.

A semiconductor device according to the present invention comprises a semiconductor element formed on a semiconductor substrate, and a pad connected to the semiconductor element. The region, in which the semiconductor element is formed, is covered by a first passivation film, with the entire surface of the pad being exposed.

In addition, with the method of manufacturing a semiconductor device according to the present invention, a semiconductor element is formed on a semiconductor substrate, and a pad to be connected to the semiconductor element is subsequently formed. Then a first passivation film is formed, with the entire surface of the pad being exposed, to cover the region in which the semiconductor element is formed.

According to the present invention as described above, since the entire surface of the pad is exposed through the first passivation film, a probing test can be performed before a bump is formed, without using an extremely high-accuracy probe. Then, a second passivation film may be formed to cover a portion of the pad, for example, after the probing test has been performed.

DETAILED DESCRIPTION OF THE PREFERRED EMBODIMENTS (First Embodiment)

To begin with, a first embodiment of the present invention will be described. Here, for convenience, a structure of a semiconductor device will be described along with a method of manufacturing the semiconductor device. FIGS. 1A and 1B, to FIGS. 4A and 4B are diagrams illustrating, in the order of processing, a method of manufacturing the semiconductor device according to the first embodiment of the present invention. FIGS. 1A to 4A are top views, and FIGS. 1B to 4B are cross-sectional views taken along line I-I in FIGS. 1A to 4A.

Figure 1A:
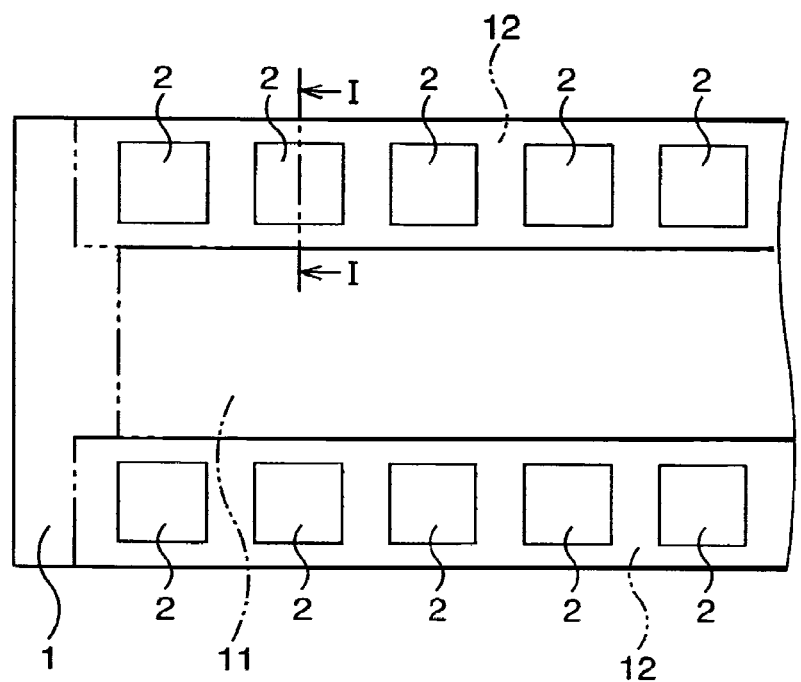
FIGS. 1A and 1B, to FIGS. 4A and 4B are diagrams illustrating, in the order of processing, a method of manufacturing a semiconductor device according to a first embodiment of the present invention.
Figure 1B:
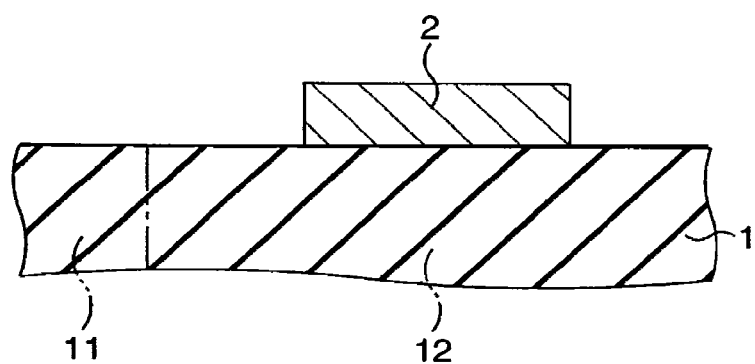

In the first embodiment, a semiconductor element (not shown) such as a transistor is formed on a semiconductor substrate, then an insulation film 1 covering the semiconductor element is formed, as shown in FIGS. 1A and 1B. Here, although only the region corresponding to a single LSI chip is shown in FIGS. 1A and 1B, to FIGS. 4A and 4B, a plurality of regions reserved for chip formation are provided on a single semiconductor substrate (wafer). Each of the regions reserved for chip formation is partitioned into an internal element region 11 having the semiconductor element formed thereon, and input/output (I/O) regions 12 having I/O terminals (bumps) provided therein for inputting and outputting signals between the semiconductor element and an external power source, circuits and the like. The I/O regions 12 are provided, for example, in two locations which extend parallel to each other, sandwiching the internal element region 11 in between.

Next, contact plugs (not shown) are formed in the insulation film 1 for connecting the I/O terminals which will be subsequently formed and the semiconductor element within the internal element region 11. Then, as shown in FIGS. 1A and 1B, a plurality of pads 2, a power line (not shown) and lead wirings (not shown) are formed on the insulation film 1 within the I/O regions 12. The pads 2 are made of Al, for example. In addition, the pads 2 are connected to the contact plugs formed in the insulation film 1 via, for example, the lead wirings and the power lines.

Figure 2A:
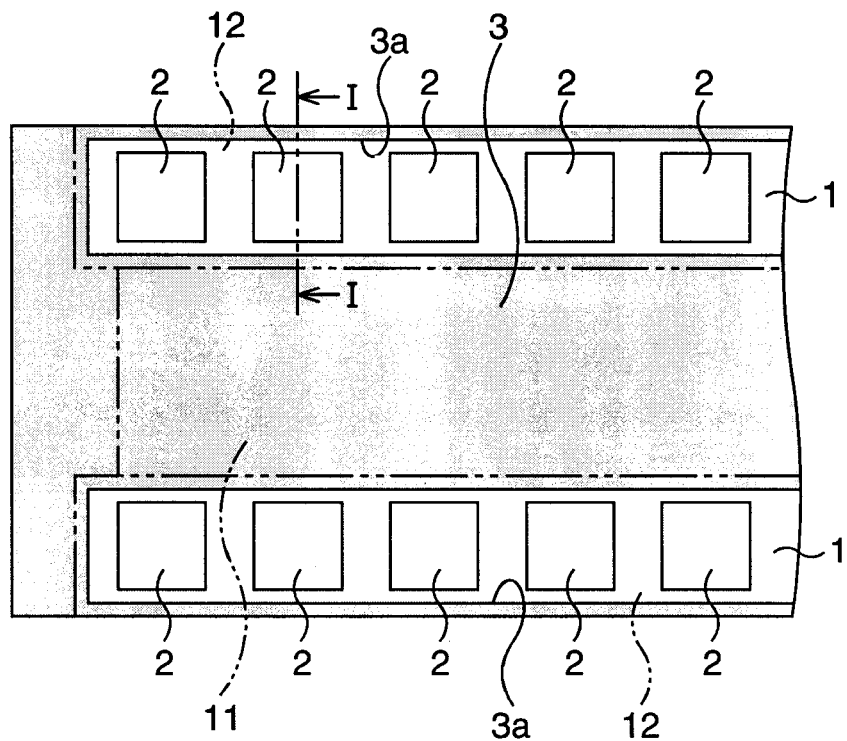
Figure 2B:
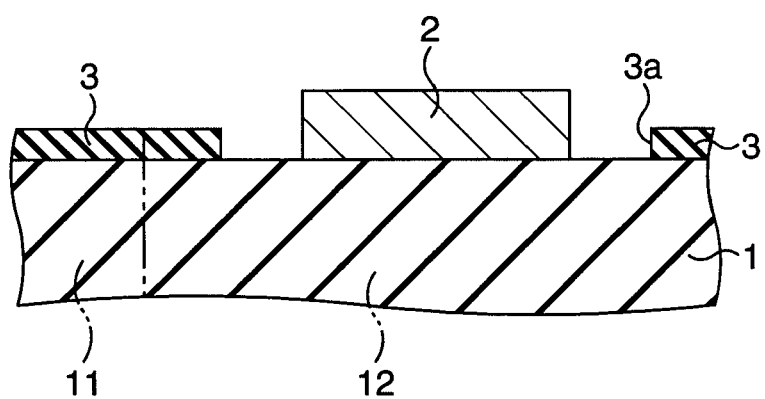

Subsequently, as shown in FIGS. 2A and 2B, a passivation film 3 is formed on the entire surface thereof, then opening parts 3a for exposing all of the pads 2 are formed in the passivation film 3. A SiN film, for example, can be used as the passivation film 3, and a high-density plasma method, for example, can be used as its formation method. The planar shape of the opening part 3a is belt-shaped, for example. Even in this state, the semiconductor device may be ready for transferring, lending or the like.

Figure 3A:
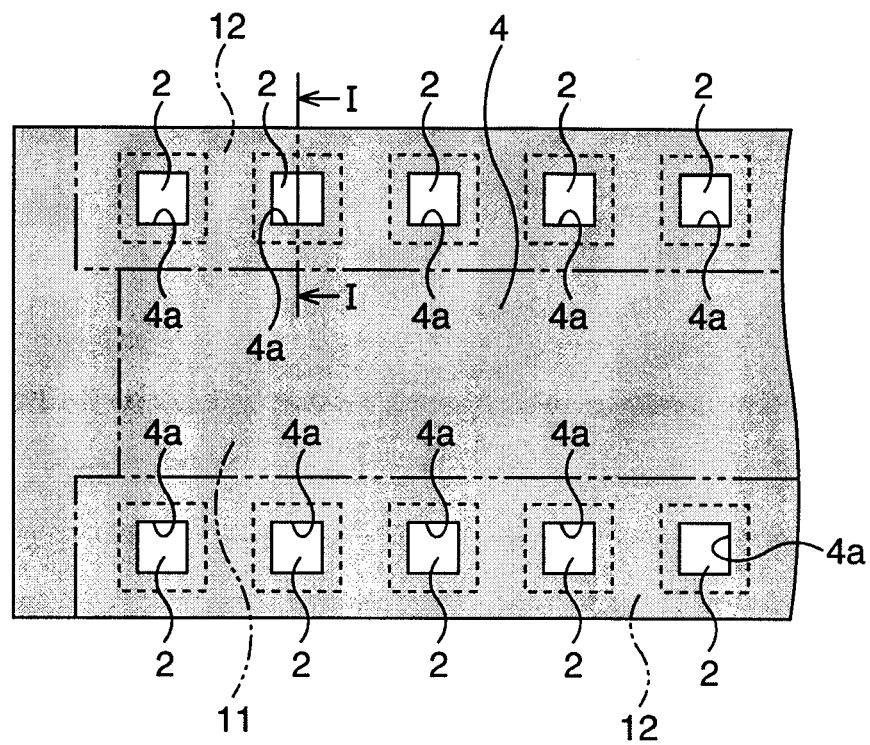
Figure 3B:
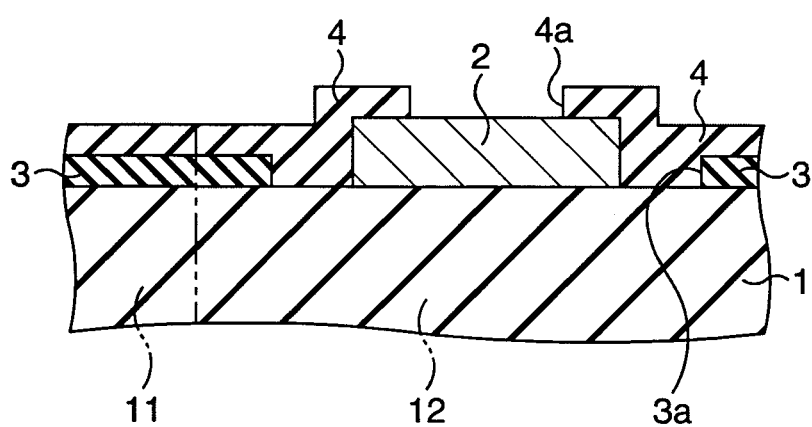

Subsequently, as shown in FIGS. 3A and 3B, a passivation film 4 is formed on the entire surface thereof. A SiN film, for example, can be used as the passivation film 4, and the high-density plasma method, for example, can be used as the formation method. Next, an opening part 4a for exposing the central portion of the pad 2 is formed on the passivation film 4 for each of the pads 2. The planar shape of the opening part 4a is square-shaped, for example.

Figure 4A:
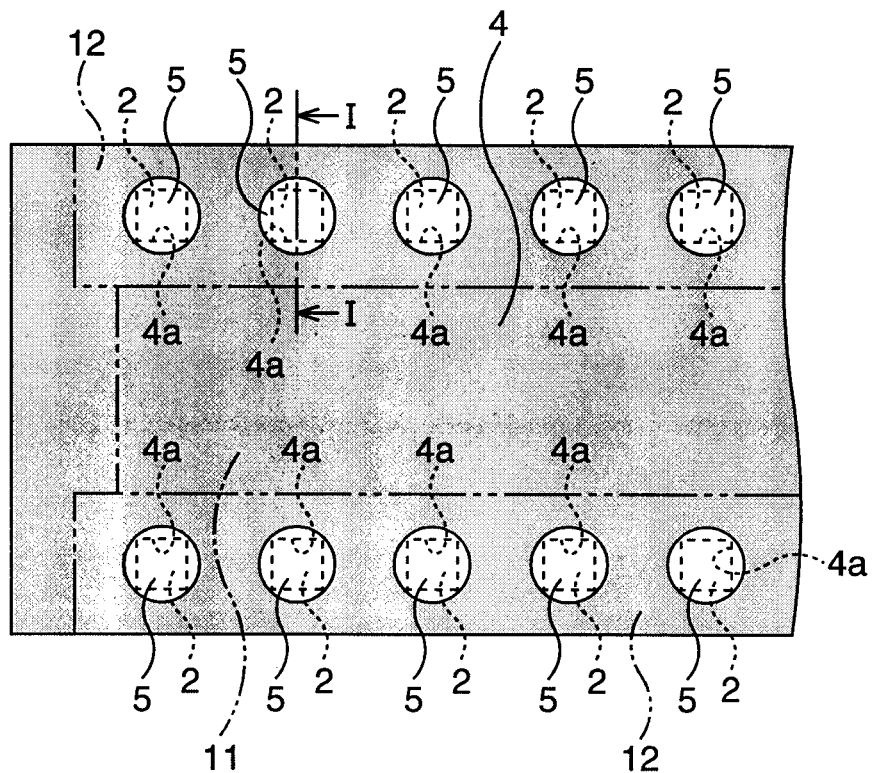
Figure 4B:
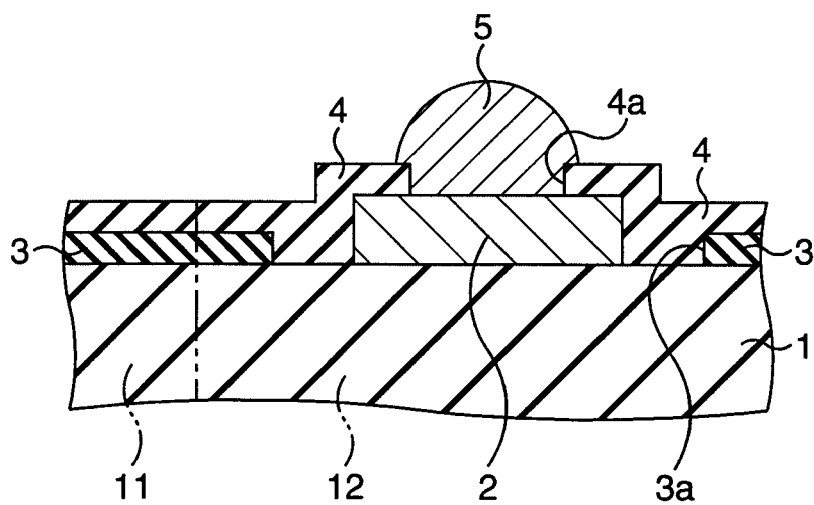

Subsequently, as shown in FIGS. 4A and 4B, a bump 5 is formed for each of the pads 2, thereby completing the semiconductor device.

In the first embodiment as such, the probing test can be performed in a state that the opening part 3a is formed in the passivation film 3. Performing the probing test in such a state increases the probability that the probe contacts the pads 2 since the entire surface of the pads 2 is exposed, thereby providing the test with higher accuracy. Thus, the pads can be miniaturized and the pitches can be narrowed without requiring the higher accuracy for the probe.

In addition, defects which had already arisen before the bump 5 was formed can be detected by performing the test before the formation of the bump 5. Thus, the extent of reliability, with regard to the semiconductor device before the bump 5 is formed, can also be assured. In other words, even in the case where a defect is found in a test performed after the bump 5 has been formed, it can be determined whether the defect had existed before the bump 5 was formed or the defect arose during the formation of the bump 5.

Here, the semiconductor device which is completed as described above may be joined, for example, to a tape carrier by TAB (Tape Automated Bonding), or applied to COF (Chip On Film).

(Second Embodiment)

A second embodiment of the present invention will be described next. Here, for convenience, a structure of a semiconductor device will be described along with a method of manufacturing the semiconductor device. FIGS. 5A and 5B, to FIGS. 7A and 7B are diagrams illustrating, in the order of processing, the method of manufacturing the semiconductor device according to the second embodiment of the present invention. FIGS. 5A to 7A are top views, and FIGS. 5B to 7B are cross-sectional views taken along line II-II in FIGS. 5A to 7A. Here, only an I/O region 12 is shown in FIGS. 5A and 5B, to FIGS. 7A and 7B.

Figure 5A:
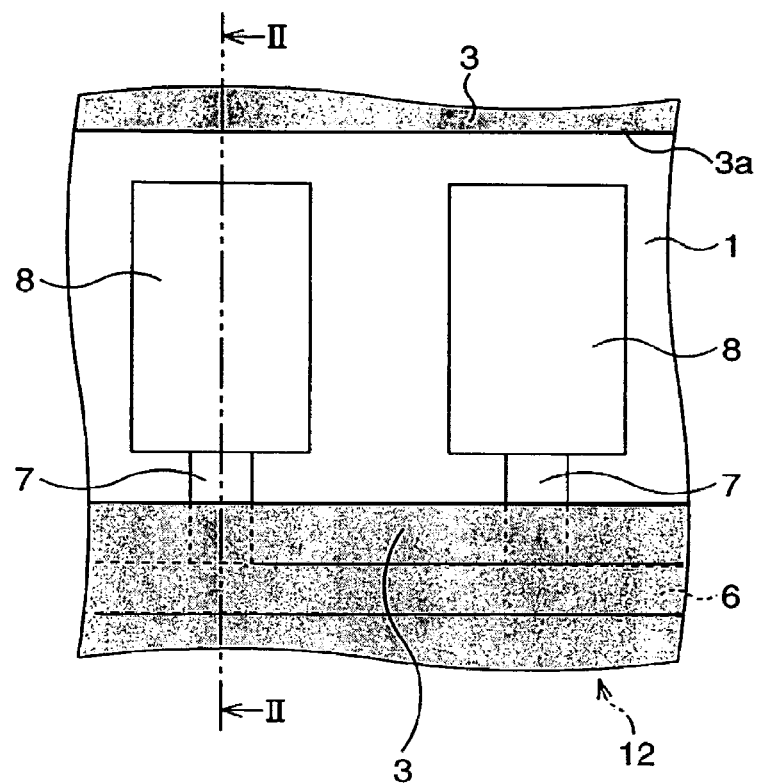
FIGS. 5A and 5B, to FIGS. 7A and 7B are diagrams illustrating, in the order of processing, a method of manufacturing a semiconductor device according to a second embodiment of the present invention.
Figure 5B:
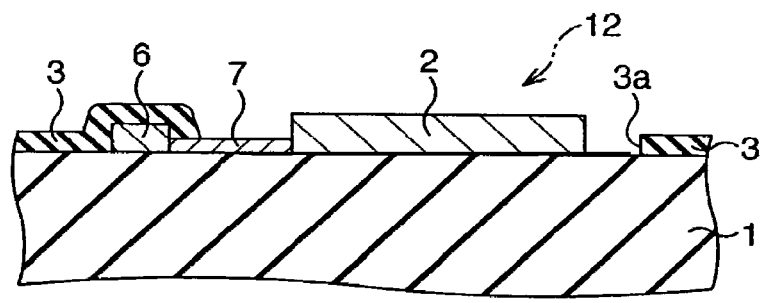

In the second embodiment, as shown in FIGS. 5A and 5B, series of processes are performed until contact plugs (not shown) are formed in an insulation film 1 as with the first embodiment. Next, in the I/O region 12, a plurality of pads 8, a power line 6 and lead wirings 7 are formed on the insulation film 1.

In the present embodiment, the pads 8 are rendered to have a rectangular planar shape, with the short side arranged in parallel with the direction along which the pads 8 are aligned. Additionally, the power line 6 extends in the direction along which the pads 8 are aligned, and the pads 8 are connected, as with the first embodiment, to the contact plugs formed in the insulation film 1 via the lead wirings 7 and the power line 6, for example, or the like.

Next, a passivation film 3 is formed on the entire surface thereof, and then an opening part 3a for exposing all of the pads 8 is formed in the passivation film 3. The planar shape of the opening part 3a is belt-shaped, for example. As with the first embodiment, the semiconductor device may be ready for transferring, lending or the like even in this state.

Figure 6A:
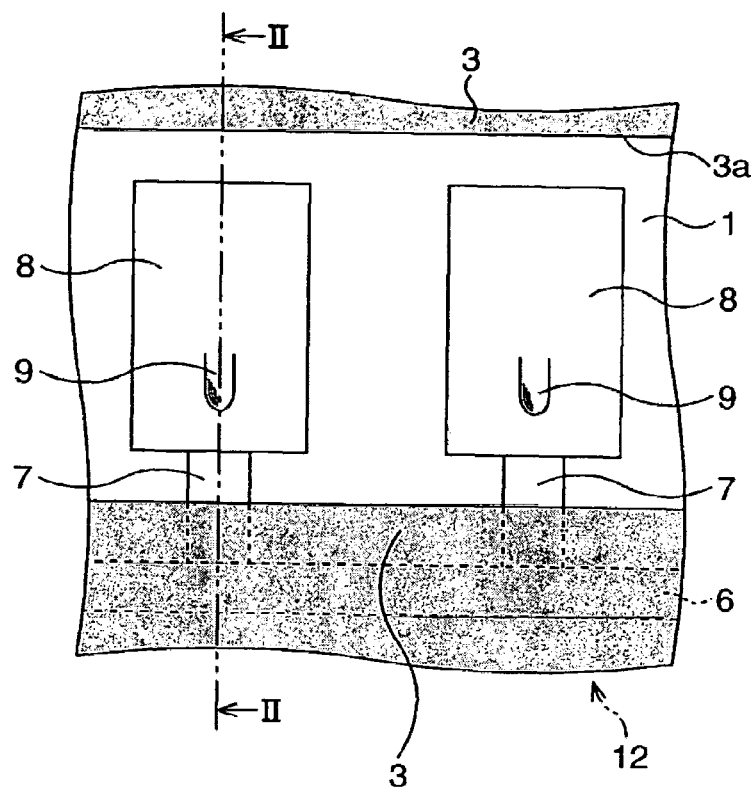
Figure 6B:
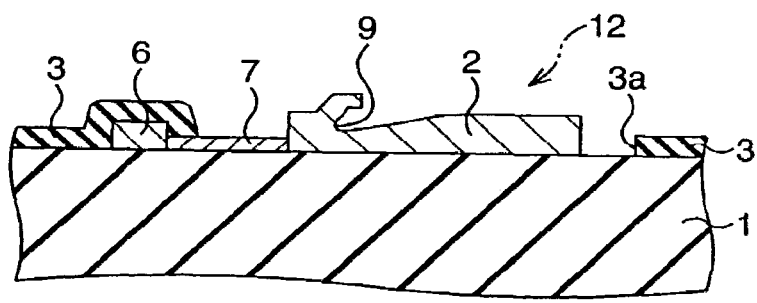

In addition, the probing test can be performed after the opening part 3a has been formed. When performing the probing test, the probe, for example, is pressed toward a position closer the power line 6 relative to the center of the pads 8. Then the probing test is performed. As a result, a trace 9 of the probe is formed in the pad 8 as shown in FIGS. 6A and 6B.

Figure 7A:
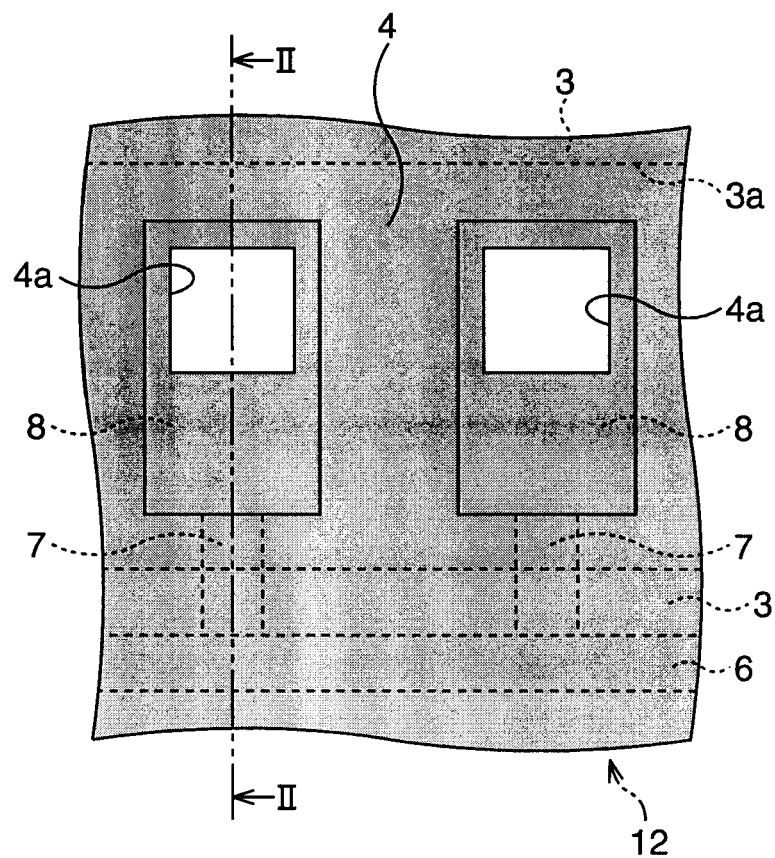
Figure 7B:
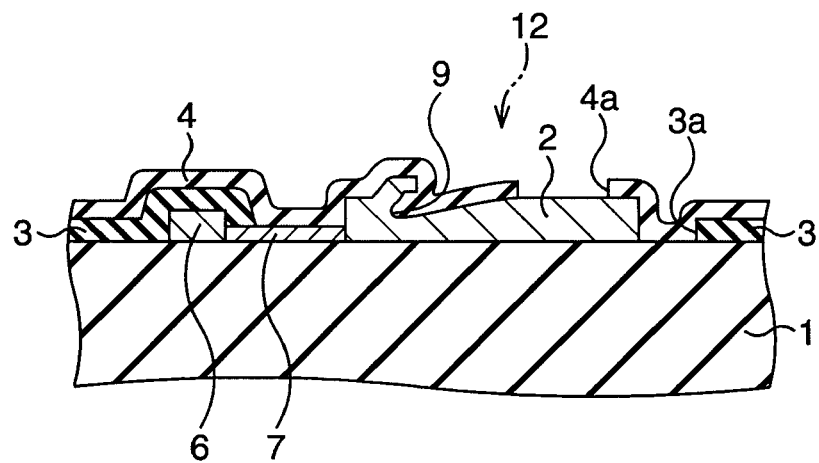

After the probing test has been performed, a passivation film 4 is formed on the entire surface thereof, as shown in FIGS. 7A and 7B. Next, an opening part 4a for exposing a region separated away from the power line 6 relative to the center of the pad 8 is formed in the passivation film 4 for each of the pads 8. The planar shape of the opening part 4a is square-shaped, for example. As a result, the trace 9 of the probe is completely covered by the passivation film 4.

Then, as with the first embodiment, a bump (not shown) is formed on each of the pads 8. The semiconductor device is thus completed.

According to the second embodiment as such, it is not only possible to obtain a similar effect as with the first embodiment but also to reliably cover the trace 9, which was formed by pressing the probe, with the passivation film 4, whereby formation of a bump on the trace 9 can be avoided. If a bump is formed on the trace 9 of the probe, the bump may transform, or have insufficient tensile strength at the TAB (Tape Automated Bonding). Such an inconvenience can be preliminarily avoided in the present embodiment, since no bump will be formed on the trace 9 of the probe, as stated above.

(Third Embodiment)

Figure 8:
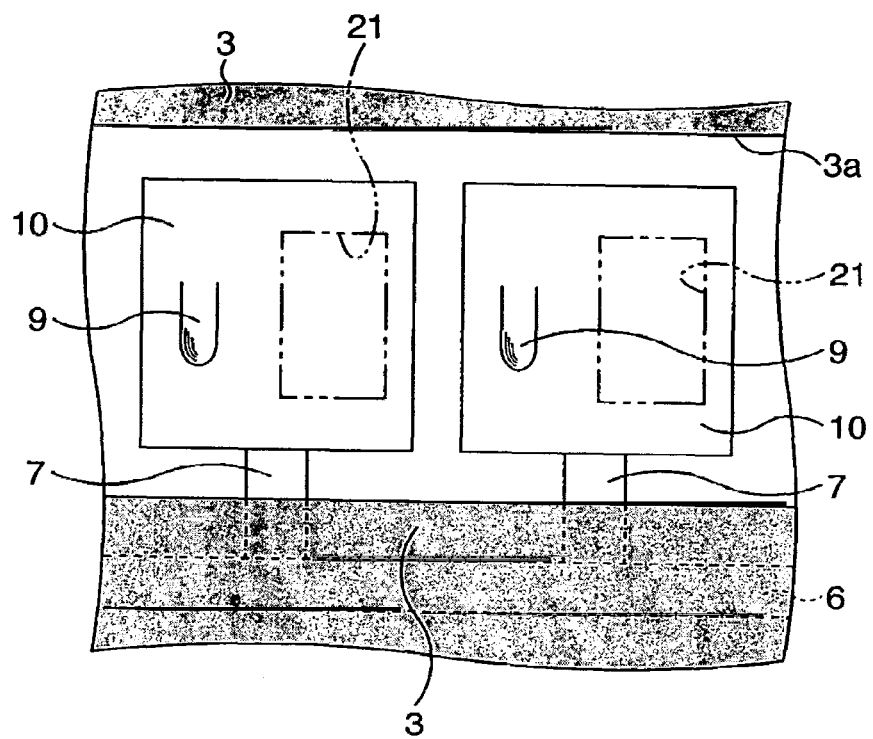
FIG. 8 is a cross-sectional view illustrating a method of manufacturing a semiconductor device according to a third embodiment of the present invention.

A third embodiment of the present invention will be described next. Here, for convenience, a structure of a semiconductor device will be described along with a method of manufacturing the semiconductor device. FIG. 8 is a cross-sectional view illustrating the method of manufacturing the semiconductor device according to the third embodiment of the present invention. Here, only an I/O region 12 is shown in FIG. 8.

In the third embodiment, as shown in FIG. 8, series of processes are performed until contact plugs (not shown) are formed in an insulation film 1 as with the first embodiment. Next, in the I/O region 12, a plurality of pads 10, a power line 6 and lead wirings 7 are formed on the insulation film 1.

In the present embodiment, the pads 10 are rendered to have a square planar shape. Additionally, the power line 6 extends in the direction along which the pads 10 are aligned, and the pads 10 are connected, as with the first embodiment, to the contact plugs formed in the insulation film 1 via the lead wirings 7 and the power line 6, for example, or the like.

Next, a passivation film 3 is formed on the entire surface thereof, and then an opening part 3a for exposing all of the pads 8 is formed in the passivation film 3. The planar shape of the opening part 3a is belt-shaped, for example. As with the first embodiment, the semiconductor device may be ready for transferring, lending or the like even in this state.

In addition, the probing test can be performed after the opening part 3a has been formed. When performing the probing test, the probe, for example, is pressed toward a position off relative to the center of the pads 10 in the direction aligned the pads 10. Then the probing test is performed. As a result, a trace 9 of the probe is formed on the pads 8 as shown in FIG. 8.

After the probing test has been performed, a passivation film (not shown) is formed on the entire surface thereof, as with the first embodiment. Next, an opening part (not shown) is formed in the passivation film, for each of the pads 10, to expose a region (region reserved for opening part formation 21) which is away from the trace 9 relative to the center of the pads 10. The planar shape of the opening part 4a is rectangular, for example. As a result, the trace 9 of the probe is completely covered by the passivation film, as with the second embodiment.

According to the third embodiment as such, a similar effect as with the second embodiment can be obtained.

Here, the pads, the lead wiring, and the power line can be formed by depositing a plurality of Al films. If the pads are formed from three Al films, for example, the lead wiring may be formed simultaneously with the lowermost one of the three Al films composing the pads, and the power line may be formed simultaneously with two of the three Al films composing the pads except for the uppermost one.

Now a method of forming a bump will be described. Here, processes will be described with regard to after a structure shown in FIG. 9A has been formed. In the state shown in FIG. 9A, a semiconductor elements (not shown) are formed on the surface of a semiconductor substrate (not shown), above which a SiN film 51 is formed in which barrier metal films 52 and W plugs 53 are embedded. A barrier metal film 54, metal wiring 55 and a barrier metal film 56 are laminated on the SiN film 51. Further on the laminated films on the SiN film 51, a CVD insulation film 57 and a SiN film 58 which cover the barrier metal film 54, the metal wiring 55 and the barrier metal film 56 are formed. Barrier metal films 59 and W plugs 60 are embedded in the CVD insulation film 57 and the SiN film 58. A barrier metal film 61, a pad 62 composed of AlCu alloy, for example, and a barrier metal film 63 are laminated on the SiN film 58. A CVD insulation film 64 and a SiN film 65 which cover the barrier metal film 61, the pad 62 and the barrier metal film 63 are further laminated on the SiN film 58. The CVD insulation films 57 and 64 are, for example, high density plasma oxidation films. Then, a polyimide coating film 66 is selectively formed on the SiN film 65. The barrier metal film 63, the CVD insulation film 64 and the SiN film 65 have an opening part formed therein to expose the pad 62.

Figure 9A:
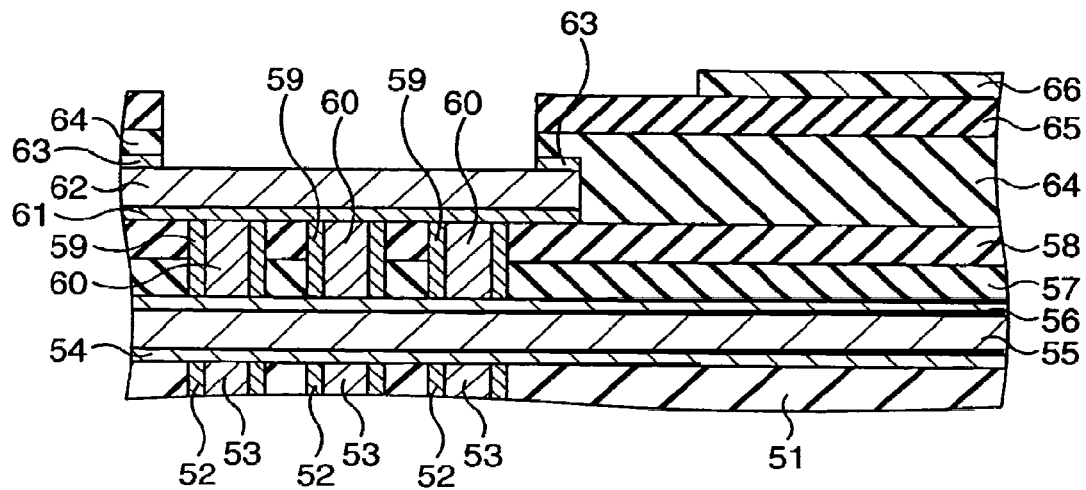
FIGS. 9A to 9F are cross-sectional views illustrating, in the order of processing, a method of forming a bump.
Figure 9B:
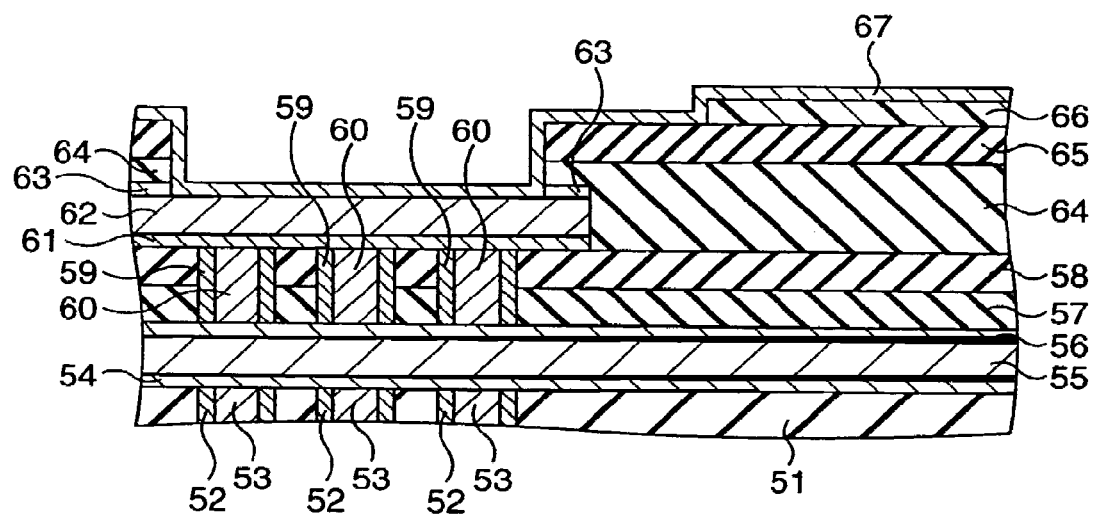

After the structure as described above has been formed, a barrier metal film 67 is formed on the entire surface thereof for plated electrodes, as shown in FIG. 9B.

Figure 9C:
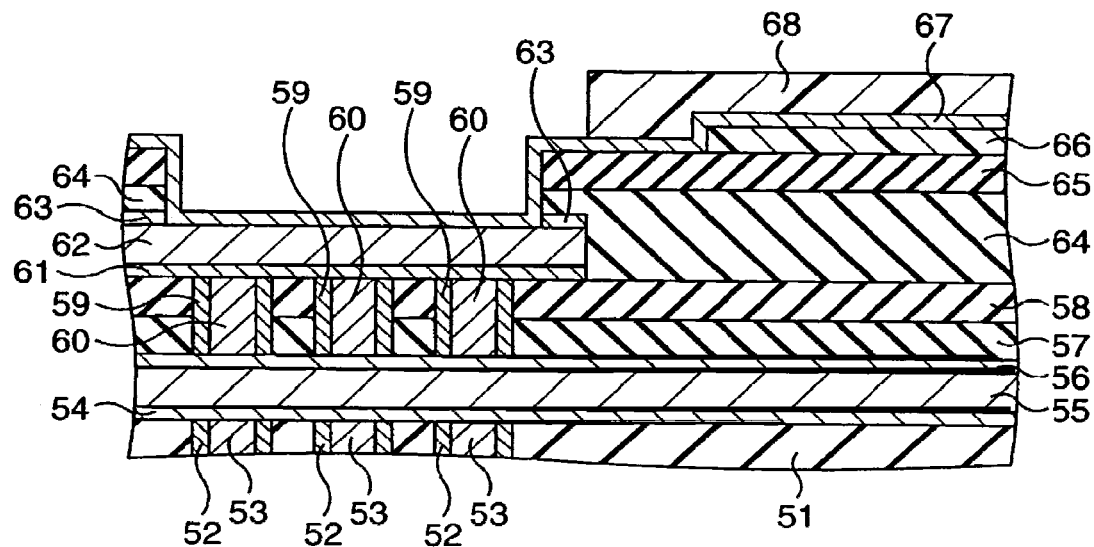

Next, as shown in FIG. 9C, a resist mask 68 is formed to cover the polyimide coating film 66. At this point, an opening part is formed in the resist mask 68 to align with the opening part which exposes the pad 62.

Figure 9D:
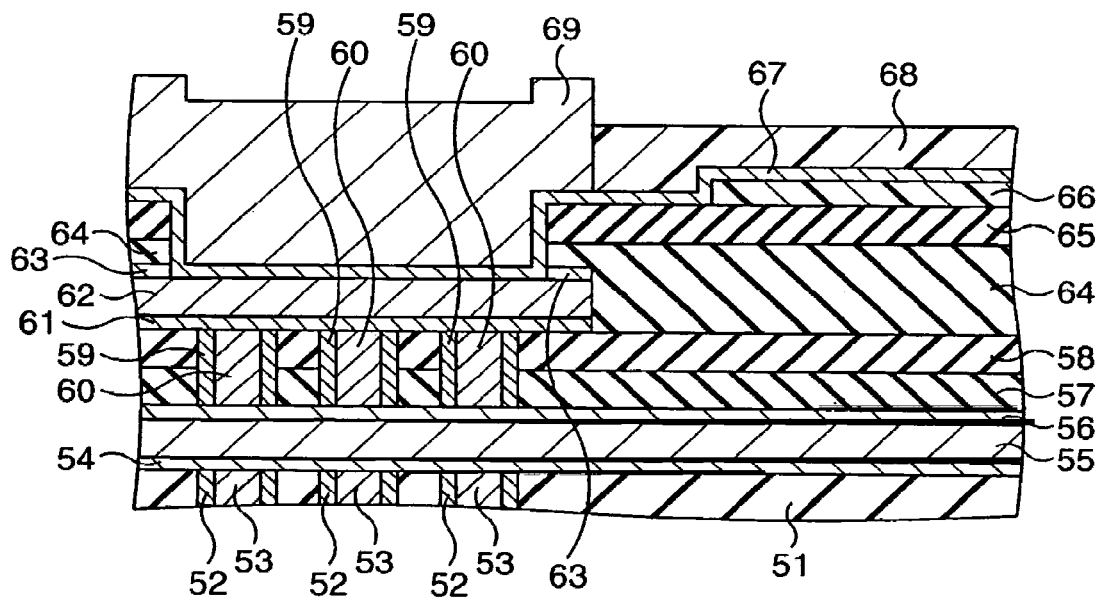

Next, as shown in FIG. 9D, a bump 69 is formed by plating, in the opening part of the resist mask 68 and the opening parts of the barrier metal film 63, the CVD insulation film 64 and the SiN film 65. The bump 69 is made of Au, for example.

Figure 9E:
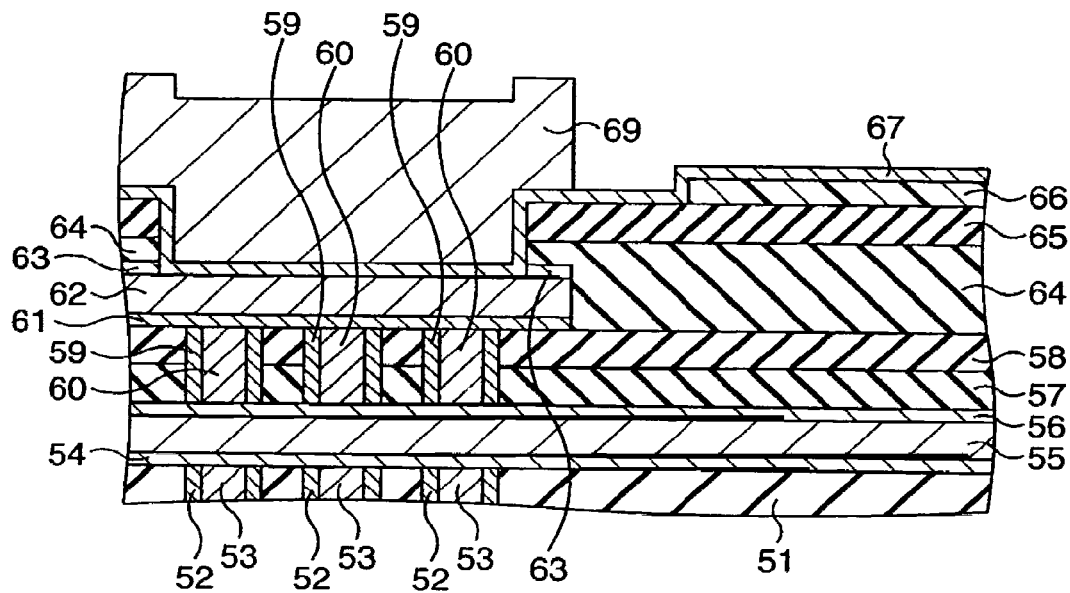

Subsequently, as shown in FIG. 9E, the resist mask 68 is removed.

Figure 9F:
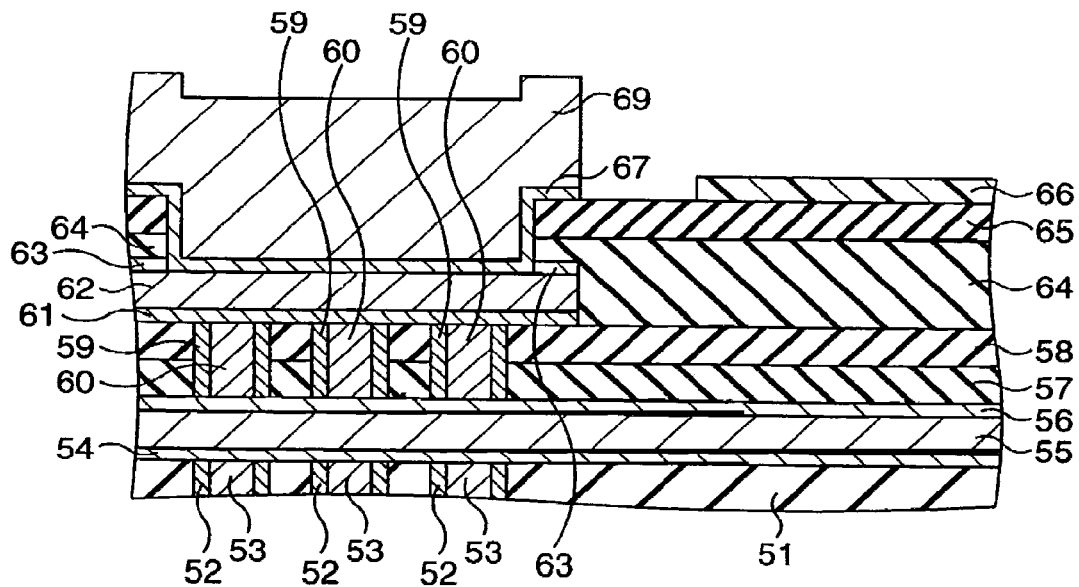

Then, as shown in FIG. 9F, the barrier metal film 67 exposed from the bump 69 is removed.

Here, the polyimide coating film 66 may not be formed. In addition, although FIG. 9A shows the W plugs 53 and 60 as being located directly below the region in which the bump 69 is formed, the location where they are formed is not limited in any manner.

INDUSTRIAL APPLICABILITY

According to the present invention, as described in detail above, since the entire surface of the pad is exposed through the first passivation film, the probing test can be readily performed before formation of the bump, without having to use an extremely high-accuracy probe. Thus, reliability can be guaranteed with regard to the state before the bump is formed. In addition, even when a trace of the probe is formed on the bump by the probing test, deformation of the bump or shortage of tensile strength can be avoided when joining, by covering the trace with the second passivation film subsequently formed.

What is claimed is:

1. A method of manufacturing a semiconductor device comprising:
   forming a semiconductor element above a semiconductor substrate;
   forming a pad connected to said semiconductor element; and
   forming a first passivation film which covers a region in which said semiconductor element is formed, with an entire surface of said pad being exposed,
   forming a second passivation film on said first passivation film, said second passivation film covering said region in which said semiconductor element is formed and an edge of said pad with a portion of said pad being exposed.

2. The method of manufacturing the semiconductor device according to claim 1, wherein said forming said second passivation film comprising:
   forming a second film which covers said region in which said semiconductor element is formed and said pad; and
   forming an opening part which exposes a portion of said pad in said second passivation film.

3. The method of manufacturing the semiconductor device according to claim 1, wherein, if a trace of a probe is formed on said pad, said second passivation film is formed so as to cover said trace.

4. The method of manufacturing the semiconductor device according to claim 3, wherein
   a plurality of said pads is formed in alignment along one direction, and
   said second passivation film is formed so that said portions of said pads exposed from said second passivation film and said traces are aligned together with in a direction parallel to the direction along which said pads are aligned.

5. The method of manufacturing the semiconductor device according to claim 3, wherein
   a plurality of said pads is formed in alignment along one direction, and
   said second passivation film is formed so that said portions of said pads exposed from said second passivation film and said traces are aligned together with in a direction perpendicular to the direction along which said pads are aligned.

6. The method of manufacturing the semiconductor device according to claim 5, wherein a planar shape of each of said pads is rendered to be a rectangle extending in a direction perpendicular to the direction along which said pads are aligned.

7. The method of manufacturing the semiconductor device according to claim 1, wherein a SiN film is formed as said first passivation film.

\* \* \* \* \*